United States Patent [19]

LaFratta

[11] 4,151,485
[45] Apr. 24, 1979

[54] DIGITAL CLOCK RECOVERY CIRCUIT

[75] Inventor: Laurence A. LaFratta, Dallas, Tex.

[73] Assignee: Rockwell International Corporation, El Segundo, Calif.

[21] Appl. No.: 853,149

[22] Filed: Nov. 21, 1977

[51] Int. Cl.² .............................................. H03B 3/04
[52] U.S. Cl. ...................................... 331/1 A; 331/8; 331/11; 331/27
[58] Field of Search ....................... 331/1 A, 8, 10–12, 331/18, 25, 27

[56] References Cited

U.S. PATENT DOCUMENTS

| 3,825,855 | 7/1974 | Basset et al. | 331/11 X |
| 3,882,412 | 5/1975 | Apple, Jr. | 331/10 X |
| 4,027,274 | 5/1977 | Fukui et al. | 331/1 A X |
| 4,107,623 | 8/1978 | Graf et al. | 331/11 X |

Primary Examiner—Siegfried H. Grimm
Attorney, Agent, or Firm—Howard R. Greenberg; H. Fredrick Hamann

[57] ABSTRACT

A digital clock signal tracks a pulse stream data signal by developing two phase-lock restorative voltages through a phase-locked loop circuit which control the loop VCO that generates the clock signal, one voltage, designated as fine, being developed through a digital up/down counter and a digital/analog converter whenever the phase difference between the two signals exceeds a first threshold, and the second voltage, designated as coarse being generated by combining with the fine voltage a voltage to reduce or increase its value before application to the VCO so that the altered control voltage rapidly restores phase-lock whenever the phase difference exceeds a second threshold greater than that of the first.

9 Claims, 2 Drawing Figures

DIGITAL CLOCK RECOVERY CIRCUIT

BACKGROUND OF THE INVENTION

The present invention pertains generally to clock recovery circuits for supplying a digital clock signal for detecting digital data and specifically to a phase-locked loop circuit for performing that function.

The detection of data communications at a receiver requires the use of a local clock which must be synchronized to that employed at the transmitter for defining the data periods. A common technique presently utilized for effectuating synchronization is to encode the transmitter clock signal in the data so that it can be retrieved from the data signal itself at the receiver. Although there are many well known circuits for recovering a digital clock signal from the data signal, particularly those of the phase-locked loop type, these do not afford the simplicity of design as the present invention together with the level of performance which optimizes maintenance of synchronization once it has been attained.

With the foregoing in mind, it is a primary object of the present invention to provide a new and improved clock recovery circuit for generating a digital clock signal which is synchronized to a data signal.

It is a further object of the present invention to provide such a clock recovery circuit that is simple in design, yet affords a high degree of reliability in maintaining synchronization between the clock and data signals.

It is still a further object of the present invention to provide such a new and improved clock recovery circuit that employs a digitalized phase-locked loop circuit.

The foregoing objects, as well as others, and the means by which they are achieved may best be appreciated by referring to the Detailed Description of the Invention which follows hereinafter together with the drawings.

BRIEF DESCRIPTION OF THE INVENTION

In accordance with the foregoing stated objects, the present invention affords a digital clock signal that is synchronized to a data signal through a digitalized phase-locked loop circuit that comprises a voltage controlled ocsillator (VCO) for generating the clock signal under the control of the output of an up/down digital counter via a digital/analog (D/A) converter and a phase detector for effecting a count change in the counter whenever the phase difference between the data and clock signals exceeds a first threshold, the direction of change being such as to reduce the aforesaid phase difference. The output of the D/A converter is considered to be a fine voltage for controlling the VCO. A coarse control circuit is employed in combination therewith which supplies a voltage that is combined with the fine voltage to reduce or increase its magnitude before application to the VCO whenever the phase difference between the clock and data signals exceeds a second threshold which is greater than the first threshold. The resultant voltage, designated as coarse, drives the VCO frequency to rapidly restore phase-lock. In the preferred embodiment, this voltage is made to assume either of the operating range voltage limits of the VCO in order to rapidly drive the oscillator to one of its frequency limits so as to quickly reduce the phase difference. Once the phase difference falls below the first threshold, the coarse voltage is terminated thereby restoring exclusive control over the VCO to the digital phase-locked loop circuit. Additionally, a signal fade detector is provided for monitoring the loss of a data signal, as may happen in rf communications, in response to which it deactivates the coarse control circuit in order to maintain the VCO at its frequency just prior to signal fade. As will be appreciated, this insures that synchronization is not inadvertently lost by virtue of the momentary absence of a data signal.

DETAILED DESCRIPTION OF THE INVENTION

Figure 1:
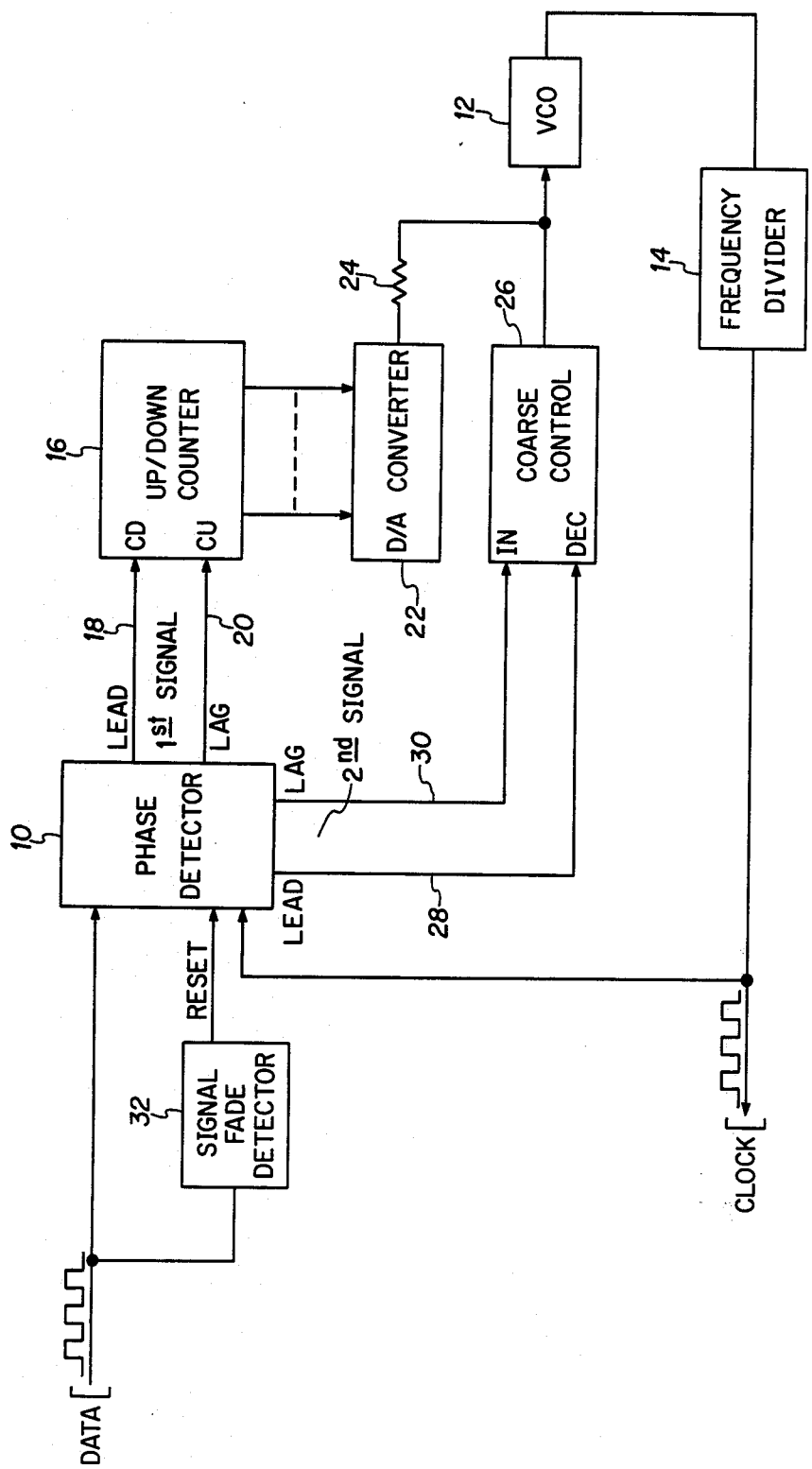
FIG. 1 is a block diagram depicting the invention.

As shown in FIG. 1, a data signal consisting of a stream of binary pulses is applied to a phase detector 10 in which its phase is compared with that of a digital clock signal generated by a voltage controlled oscillator (VCO) 12 which is applied thereto, normally through a frequency divider 14. The clock signal would normally be used in some timing circuitry (not shown) to retrieve the data from the pulse stream by defining the data bit periods, and consequently the clock signal is to be synchronized with the data pulse stream so that each signal pulse gives rise to a clock pulse. The phase detector 10 is designed to generate a first output signal whenever the phase difference between the data and clock signals (specifically corresponding to the edges of their respective pulses) exceeds some predetermined threshold. This first output signal is applied to a digital up/down counter 16 to cause it to decrement or increment its count dependent on which of the leads 18, (indicating that the clock signal leads the data signal), or 20 (indicating that the clock signal is lagging the data signal) respectively, the signal is applied thereto. The output of the counter 16 is applied to a digital/analog (D/A) converter 22 to convert the digital count to an analog value which is then applied to the VCO 12 via a resistor 24 to control its frequency. The converter 22 output applied to VCO 12 which will be referred to hereinafter as a fine voltage, is designed to reduce the phase difference between the data and clock signals through a monitor ciruit in the phase detector circuit 10 which determines whether or not the clock signal is leading or lagging the data signal. In response thereto, as will be explained shortly, the monitor circuit causes the first output signal to be routed to counter 16 on lead 18 to decrement the count or on lead 20 to increment the count.

Unless the fine voltage applied to the VCO 12, in response to a phase difference in excess of the first threshold corrects the clock frequency so that the phase difference falls below the first threshold, the phase difference will continue to increase. At a second threshold of phase difference which is greater than that of the first, phase detector 10 applies a second output signal to a coarse control circuit 26 whose output provides a voltage which is combined with the fine voltage to increase or reduce its value before it is applied to the VCO 12. The resultant VCO 12 control voltage, which will be referred to hereinafter as a coarse voltage, is designed to quickly drive the VCO frequency to a value which rapidly restores phase-lock. In the preferred embodiment the coarse voltage is allowed to assume either of the two voltage limits of the operating range of the VCO 12 so that when applied thereto it is driven hard to its maximum or minimum frequency. The lag-/lead monitor indicator of phase detector 10 used to route the first output signal to the up/ down counter 16 on leads 18 and 20 is similarly used to route the second output signal to coarse control circuit 26 on leads 28 and 30 to cause, respectively, a decrease or increase in the frequency of VCO 12. consequently, the frequency of the clock signal is changed rapidly in the appropriate direction to reduce the phase difference between the clock and data signals. Once the phase difference drops below the first threshold, both the first and second output signals of phase detector 10 are terminated so as to permit restoral of the VCO 12 control to the digital loop comprising the up/down counter 16.

To avoid driving the VCO 12 to one of its limits in the event that the data signal is temporarily lost, which is not inconceivable in rf communications, a signal fade detector 32 is provided to monitor the incoming data for its presence. Many different types of detector 32 will be found to be feasible, dependent, of course, on the particular design involved, as will be readily apparent to those skilled in the art. For example, many data signal structures require that a pulse be transmitted at least once for some predetermined number of consecutive pulse periods. In such case the signal fade detector 32 can monitor for the presence or absence of a data signal merely by counting the number of consecutive pulses to ascertain that the data format has not been violated, thereby assuring the presence of a data signal. The output of detector 32 is applied to phase detector 10 to reset same any time that a fade is detected, thereby inhibiting the operation of the coarse control circuit 26 as well as counter 16 since the first and second output signals cannot be generated. Accordingly no deviation in the clock signal frequency is allowed to take place.

Figure 2:
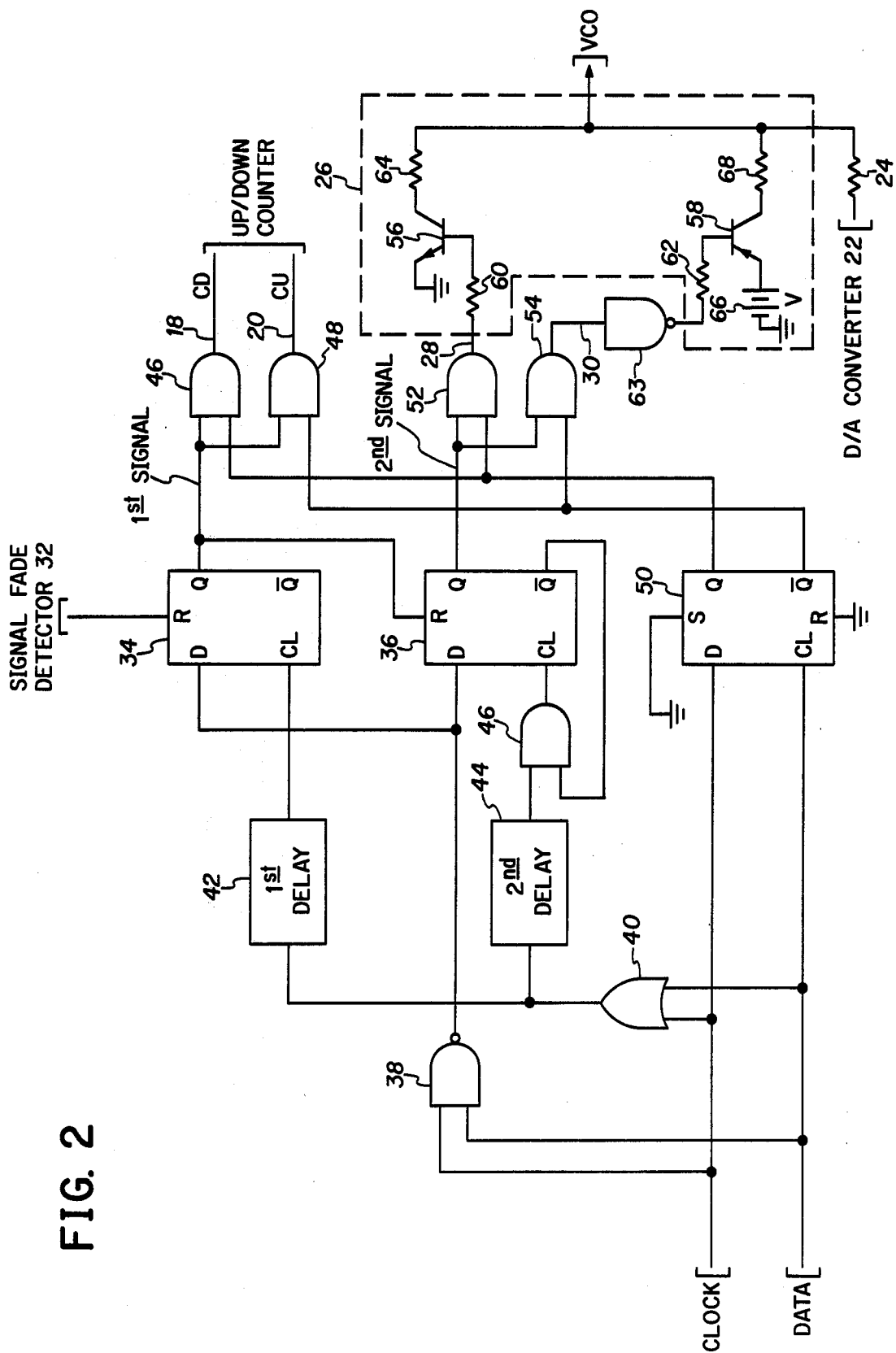
FIG. 2 is a circuit diagram depicting the phase detector and coarse control circuit of the invention.

As shown in FIG. 2, phase detector 10 comprises two D type flip-flops 34 and 36 for providing respectively the first and second output signals associated with the first and second thresholds. The D inputs to both flip-flops 34 and 36 are derived from the output of NAND gate 38 having two inputs, one connected to receive the clock signal and the other the data signal. The clock inputs CL of flip-flops 34 and 36 are derived from the output of an OR gate 40 having its two inputs likewise connected to receive the clock and data signals. The output of OR gate 40 is applied to the CL input of flip-flop 34 through a first delay circuit 42 while it is applied to the CL input of flip-flop 36 through a second delay circuit 44 via one input of an AND gate 46 whose second input is connected to the $\overline{Q}$ output of flip-flop 36. Assuming that flip-flops 34 and 36 are not in the reset state by virtue of an overriding low level signal applied to their reset R inputs, the leading edge of a pulse in either the clock or data signal causes a clock signal to be applied to flip-flop 34 via OR gate 40, of course delayed by the period introduced by the first delay circuit 42, which will be seen to correspond to the first threshold previously described. If at the end of that delay period, a pulse has not been received in the signal other than the one whose pulse gave rise to the signal for clocking flip-flop 34 in the first place, the output of NAND gate 38 will be at a high level so that upon the application of the delayed clock pulse to flip-flop 34, the high level input to its D lead will be transferred to its Q output to indicate that the phase difference between the clock and data signals exceeds the first threshold. In this connection it should be pointed out that the pulse duty cycle should be great enough to assure that the expected minimum pulse duration exceeds the minimum acceptable phase difference (first threshold) so that the respective signal pulses can overlap. If the pulse in one of the signals is followed by a pulse in the other signal in a period less than the first threshold, the ensuing low output of NAND gate 38 will be reflected at the Q output of flip-flop 34 upon the application of a delayed clock signal thereto, thereby indicating that the phase difference between the clock and data signals is less than the first threshold.

Since the Q output of flip-flop 34 is applied as an input to the R lead of flip-flop 36, the Q output of the latter can change only after flip-flop 34 has first been set (its Q output thus going to a high level) in response to a phase difference between the clock and data signals in excess of the first threshold. Thereafter the Q output of flip-flop 36 will remain low (having been previously reset by the prior resetting of flip-flop 34) so long as the phase difference between the clock and data signals does not exceed the second threshold as set by the second delay circuit 44 (the output of OR gate 38 being low at the time the delayed clock is applied to flip-flop 36). However, once the phase difference between the clock and data signals does exceed the second threshold, the high output of NAND gate 38 will be transferred from the D input to the Q output of flip-flop 36 upon application of a delayed clock signal thereto at the output of AND gate 46 ($\overline{Q}$ output of flip-flop 36 being high at this time so as to partially enable AND gate 46). The appearance of a high level signal at the Q output of 36 acts as an indication that the phase difference between the clock and data signals is greater than the second threshold level. It is to be noted that once flip-flop 36 has been set, unlike flip-flop 34 it cannot be reset via its D input since the low $\overline{Q}$ output at this time disables AND gate 46. Consequently, even when the phase difference between the clock and data signals falls below the second threshold level, flip-flop 36 continues to generate the second output signal. Flip-flop 36 is reset by virtue of its R input coincident with the resetting of flip-flop 34 which will occur when either the phase difference between the clock and data signal falls below the first threshold level or in response to the output from the signal fade detector 32 indicating temporary loss of the data signal.

The first output signal of flip-flop 34 is applied to counter 16 on leads 18 and 20 through AND gates 46 and 48, respectively, each having a second input connected to the output of a D type flip-flop 50 which serves as the lag/lead monitor indicator for the clock and data signals as previously alluded to. With the D and CL inputs of flip-flop 50 connected to receive the clock and data signals respectively, it will be readily seen that the Q output of flip-flop 50 will be high when the clock signal leads the data signal and low when it does not. With the second inputs of AND gates 46 and 48 connected to the Q and $\overline{Q}$ outputs, respectively, of flip-flop 50, the first output signal of flip-flop 34 will pass through enabled AND gate 46 to decrement counter 16 when the clock signal is leading, and enabled AND gate 48 to increment counter 16 when it is lagging. Thus the first output signal will be properly routed so as to effect a count change in counter 16 to alter the frequency of the VCO 12 in the proper direction.

The second output signal of flip-flop 36 is applied to the coarse control circuit 26 via leads 28 and 30 through two AND gates 52 and 54, respectively. Like AND gates 46 and 48, these two AND gates have second inputs connected to the outputs of flip-flop 50 to effect the proper signal routing at the output of coarse control circuit 26. Coarse control circuit 26 is seen to comprise two transistors 56 and 58 whose bases are respectively connected to the outputs of AND gates 52 and 54 through resistors 60 and 62, respectively with the latter being interconnected via an inverter 63. The emitter of transistor 56 is connected to a ground terminal while its collector is connected to the input of the VCO 12 via a resistor 64. The emitter of transistor 58 is connected to the positive terminal of a DC supply 66 while its collector is also connected to the VCO 12 input through a resistor 68.

It is readily evident that when AND gate 52 is fully enabled in response to the presence of the second output signal and a leading clock signal, its high output turns on transistor 56 to enable through voltage divider action, employing resistors 24 and 64, a reduced level of the fine voltage output of converter 22 to be applied to the VCO 12 so as to drive its frequency to a lower value. Assuming that zero volts is the lower limit of the operating range for the VCO 12 and that resistor 64 is extremely smaller than resistor 24, essentially zero volts will then be applied as a coarse control voltage to drive VCO 12 to its minimum frequency. When AND gate 54 is fully enabled in response to the second output signal and a lagging clock signal, its high output is applied to transistor 58 via inverter 30 to turn it on, thereby applying, through appropriate voltage divider action employing resistors 24 and 68 and a suitable value of V, a control voltage higher than the fine voltage to the VCO 12 to drive it to a higher frequency. As will be appreciated, this coarse voltage can be made to correspond to the upper limit of the VCO operating voltage range so as to drive its frequency to the maximum value by employing a DC supply voltage equal to the upper limit and a much higher resistance value for resistor 24 than resistor 68. The frequency of the VCO 12 will change quickly in the right direction so as to reduce the phase difference between the clock and data signals where it will remain until the phase difference does, in fact, fall below the first threshold level so as to reset flip-flop 34 and as a result thereof also flip-flop 36. As a consequence, normal digitalized phase-locked loop performance can be achieved for minor frequency departures while restoring phase-locked loop operation for major frequency deviations. In the preferred embodiment, 15 and 30 nanoseconds were set respectively for the first and second thresholds in conjunction with a nominal frequency of 1.54 megahertz.

As the foregoing Detailed Description delineates, the present invention provides a simple, albeit effective digitalized phase-locked loop circuit for affording a clock recovery circuit synchronized to a data signal. Since various modifications to the preferred embodiment are possible without departing from the scope and spirit of the invention, the foregoing detailed description is intended to be merely exemplary and not circumscriptive of the invention as it will now be claimed hereinbelow.

What is claimed is:

1. A clock recovery circuit for generating a clock signal which tracks a pulse stream data signal, comprising:
    voltage controlled oscillator means for providing the clock signal;
    phase difference means for monitoring the phase difference between the clock and data signals and providing first and second signals whenever the phase difference exceeds first and second thresholds, respectively, said second threshold being greater than said first and said second signal being terminated coincident with the termination of said first signal;
    relative phase means for comparing the relative phase of the clock and data signals to provide a third signal indicative of their relative positions in time;
    an up/down digital counter responsive to said first signal for changing its count, the counting direction being determined by said third signal;
    a digital/analog converter connected to the output of said digital counter;
    coarse control circuit means responsive to said second signal for providing a voltage to be combined with the output of said converter to lower or raise its magnitude as determined by said third signal;
    circuit means for applying said combined output to said oscillator means so as to reduce the aforesaid phase difference.

2. The clock recovery circuit of claim 1 wherein said combined output has a bilevel mangitude, each level corresponding to one of the voltage limits of the operating range for said voltage controlled oscillator means.

3. The clock recovery circuit of claim 1 wherein said phase difference means comprises two D-type flip-flops, each for providing said first and second output signals.

4. The clock recovery circuit of claim 1 including a data fade detector for detecting the absence of a data signal and inhibiting said coarse control means in response thereto.

5. A method for generating a clock signal which tracks a pulse stream data signal, comprising:
    generating a clock signal whose frequency is a function of a control voltage;
    monitoring the phase difference between the clock and data signals to provide first and second signals whenever the phase difference exceeds first and second thresholds, respectively, said second threshold being greater than said first threshold and said second signal being terminated coincident with the termination of said first signal;
    comparing the relative phase of the clock and data signals to provide a third signal indicative of their relative positions in time;
    changing a digital count in response to said first signal, the counting direction being determined by said third signal;
    converting the digital count to an analog voltage;
    generating a voltage to be combined with said analog voltage to lower or raise its magnitude as determined by said third signal, and
    applying the combined voltage as said control voltage to reduce the aforesaid phase difference.

6. The method of claim 5 wherein said combined output has a bilevel magnitude, each level corresponding to one of the voltage limits of the operating range of said control voltage.

7. In combination with a digital phase locked-loop circuit having a voltage controlled oscillator for providing a clock signal that tracks a pulse stream data signal under the control of the output of an up/down digital counter via a digital/analog converter and a phase detector for effecting a count change in the counter whenever the phase difference between the data and clock signals exceeds a first threshold, the direction of change being such as to reduce the aforesaid phase difference, a coarse control circuit comprising:
- means for generating and combining with the converter output a voltage to reduce the phase difference whenever it exceeds a second threshold which is greater than the first threshold;
- means for applying the combined voltage to the oscillator, and
- means for terminating the generated voltage whenever the aforesaid phase difference falls below the first threshold.

8. The coarse control circuit of claim 7 wherein said combined voltage has a bilevel magnitude, each level corresponding to one of the limits of the operating range for the voltage controlled oscillator.

9. The coarse control circuit of claim 7 including a data fade detector for detecting the absence of a data signal and inhibiting the generating means in response thereto.

* * * * *

UNITED STATES PATENT OFFICE
CERTIFICATE OF CORRECTION

PATENT NO. : 4,151,485
DATED : April 24, 1979
INVENTOR(S) : Laurence A. LaFratta It is certified that error appears in the above-identified patent and that said Letters Patent are hereby corrected as shown below:

Column 1, line 63, after "frequency" insert --in a direction--.

IN THE CLAIMS

Column 6, line 25, delete "mangitude" and substitute therefor --magnitude--.

Signed and Sealed this

Eleventh Day of September 1979

[SEAL]

Attest:

Attesting Officer

LUTRELLE F. PARKER
Acting Commissioner of Patents and Trademarks